United States Patent [19]

Himeno et al.

[11] Patent Number: 5,650,961
[45] Date of Patent: Jul. 22, 1997

[54] CELL CHARACTERISTIC MEASURING CIRCUIT FOR A NONVOLATILE SEMICONDUCTOR MEMORY DEVICE AND CELL CHARACTERISTIC MEASURING METHOD

[75] Inventors: Toshihiko Himeno, Kawasaki; Naohiro Matsukawa, Kamakura, both of Japan

[73] Assignee: Kabushiki Kaisha Toshiba, Kawasaki, Japan

[21] Appl. No.: 512,996

[22] Filed: Aug. 9, 1995

[30] Foreign Application Priority Data

Aug. 10, 1994 [JP] Japan .................... 6-188562

[51] Int. Cl.$^6$ .................................. G11C 11/34
[52] U.S. Cl. .................. 365/185.17; 365/185.11; 365/185.05
[58] Field of Search ............... 365/185.17, 185.11, 365/230.03, 185.05

[56] References Cited

U.S. PATENT DOCUMENTS

| 5,247,480 | 9/1993 | Itoh et al. | 365/185.17 |
| 5,253,206 | 10/1993 | Tanaka et al. | 365/185.22 |
| 5,379,256 | 1/1995 | Tanaka et al. | 365/185.17 |

OTHER PUBLICATIONS

C. Dunn, et al. "Flash EEPROM Disturb Mechanisms," Proceedings of 1994 IEEE/IRPS, pp. 299–308.

D.M. Hoffstetter et al. "A Systematic Test Methodology For Identifying Defect-Related Failure Mechanisms in an EEPROM Technology," Proceedings of IEEE 1994 Int. Conference on Microelectronic Test Structures, vol. 7, Mar. 1994, pp. 114–118.

Primary Examiner—David C. Nelms
Assistant Examiner—Huan Hoang
Attorney, Agent, or Firm—Banner & Witcoff, Ltd.

[57] ABSTRACT

A cell characteristic measuring circuit for a nonvolatile memory is provided which, with the use of one circuit can satisfy both the requirements necessary to a characteristic evaluation using a cell array TEG and reliability evaluation using a memory circuit. The measuring circuit comprises a cell array having a matrix array of NAND strings each having a plurality of series-connected cell transistors, a first select gate and a second select gate connected in series. The cell array is divided into a plurality of blocks, a select gate line is connected to the gates of first select gates in each NAND string in the same block, and a word line is connected to the control gates of cell transistors in each row. A first external terminal is connected to a selected bit line, and a second external terminal is connected to each word line in the plurality of blocks.

20 Claims, 8 Drawing Sheets

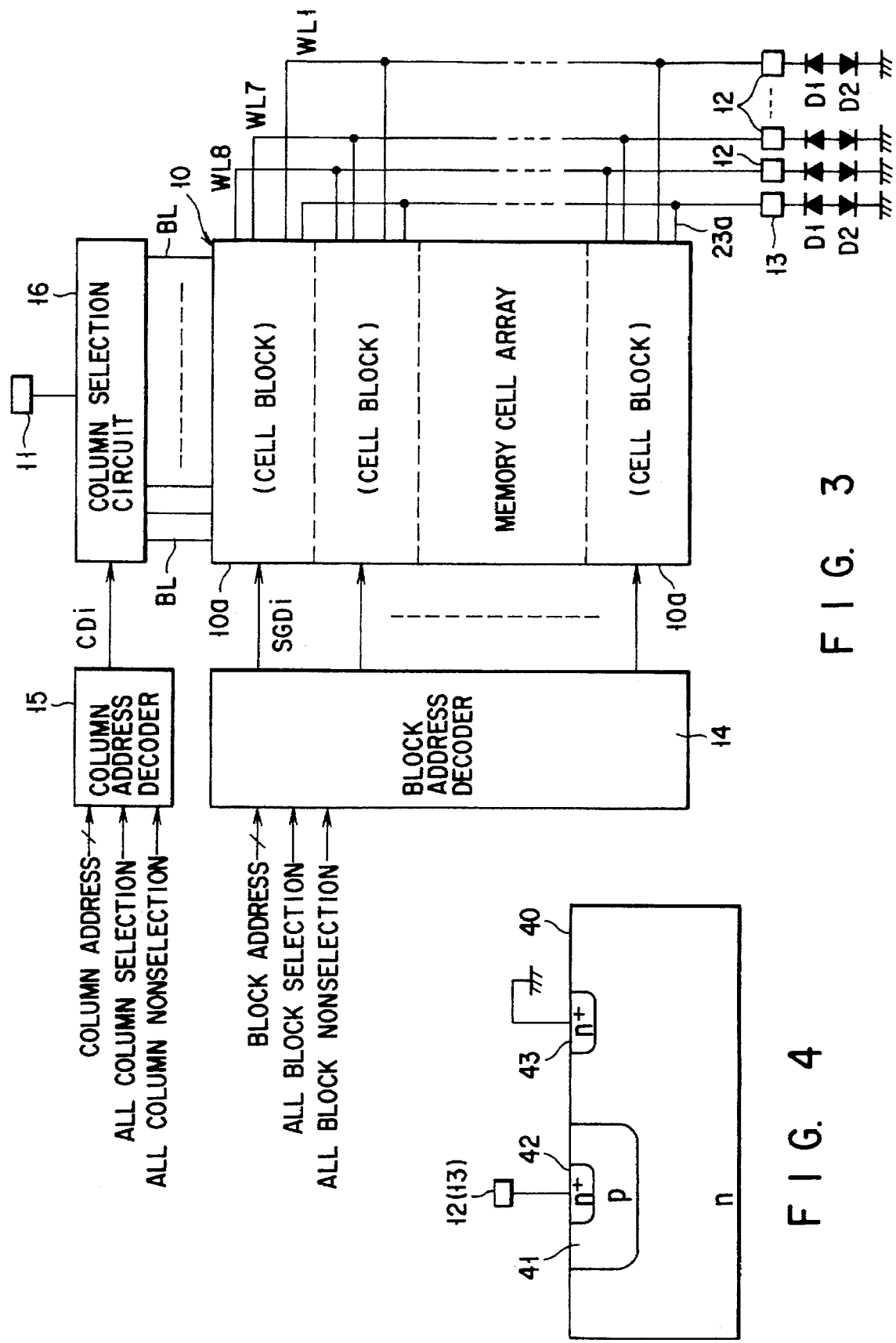
F I G. 3
F I G. 4

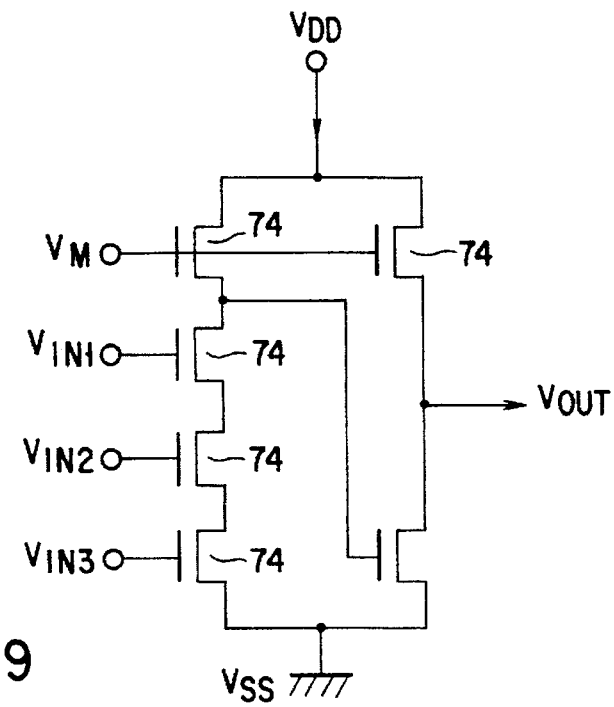
F I G. 9
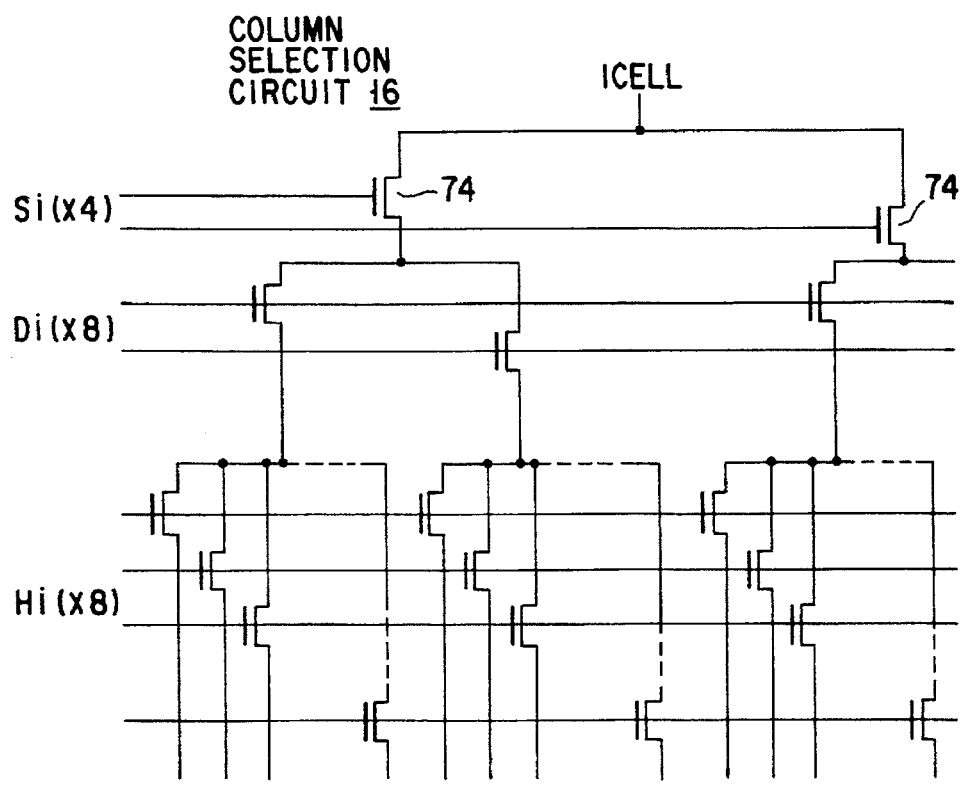
F I G. 10

CELL CHARACTERISTIC MEASURING CIRCUIT FOR A NONVOLATILE SEMICONDUCTOR MEMORY DEVICE AND CELL CHARACTERISTIC MEASURING METHOD

BACKGROUND OF THE INVENTION

1. Field of the Invention

The present invention relates to a cell characteristic measuring circuit formed on a semiconductor wafer to measure the characteristics of cell transistors in a memory cell array, and a cell characteristic measuring method.

2. Description of the Related Art

In an EEPROM and EPROM, transistors each include a stacked gate structure having a floating gate and control gate stacked with an insulating film provided relative to a substrate. The transistor has a threshold voltage value in accordance with memory information "1" and "0".

In the cell transistor having a stacked gate structure as set out above, if electric charges are stored in the floating gate, then there occurs a rise in a threshold level and hence a decrease in a cell current in a cell transistor. On the other hand, if the electric current is drawn out of the floating gate, then there occurs a fall in the threshold value and hence an increase in the cell current.

A reading circuit for reading memory contents out of the cell transistors is comprised of a combination of a sense amplifier circuit and load circuit for converting a cell current to a voltage. With "0" data representing cell memory information at a threshold value exceeding a given reference voltage of determination and "1" data, cell memory information at the threshold value not exceeding the given reference voltage of determination, the reading circuit performs a read-out operation after the conversion of the memory information of cells to continuous digital memory information.

In the development of a nonvolatile memory, various characteristics of cell transistors are determined and evaluated for their reliability. For the measurement and evaluation, there are many checking items, such as the measurement of the static characteristics of the cell transistors, write/erase characteristics, data retaining characteristics, threshold value distribution, etc. The cell transistors manufactured under various process conditions are measured and evaluated to enable an optimal condition to be determined and a cause for defects to be analyzed.

These evaluations are conducted on the individual memory cells, but those cells in a memory cell array may be variously influenced in a different way from the individual cells. Since it is necessary to measure the variation of the characteristics among cells in a large quantity, it is important to measure the characteristics of the arrayed memory cells.

In order to measure the arrayed cell transistors for their static characteristics, a cell array 80 of a simple structure is formed on a test element group (TEG) area on a semiconductor wafer as shown in FIG. 11. In the cell array TEG area, word line WLi (i=1, 2, . . . ), bit lines BLi (i=1, 2 . . . ), common source line CS, etc., are connected to many external terminals (pads) 81. Those cell transistors, corresponding to the product of the number of word line on the pads times the number of bit line on the pads, are measured for their characteristics.

In comparison with measuring characteristics of cell transistors using a memory circuit, if a cell array TEG area is used, it is possible to freely set word line voltages of the cell transistors and to directly measure cell currents of the cell transistors, though being less in the number of their measurable bits. It is, therefore, possible to make measurements with a greater latitude. Further, the cell array TEG area can be formed simply through the formation process of the cell transistors, thus ensuring a shorter period of manufacture as well as high efficiency in development.

It is to be noted, however, that the memory circuit is used for reliability evaluation necessary to the measurement of cells in a large quantity, such as the threshold value distribution of the cell transistors and data retaining characteristics.

For the measurement of the cell array TEG area, checking items are restricted for evaluation and, further, the number of measurable cells corresponds to the product of the number of word lines on pads times the number of bit lines on the pads. If this is the case, the practical limit is on the order of a few hundred. In the case where those items for reliability evaluation have a probability of one in a few M bits (or more), it is possible to measure only a few hundred, so that no correct evaluation is conducted. For the evaluation of threshold value distribution, the items measurable at this time are too small in number in view of being on the order of a few hundred bits.

On the other hand, the reliability evaluation using the memory circuit is low in the freedom with which word line voltages are set. Further, it is difficult to negatively bias the word lines, so that a negative threshold value cannot be readily set. In order to enable the word lines to be biased negatively, an associated circuit arrangement, including a word line decoder circuit, etc., becomes very complicated.

In the reliability evaluation, defective cells are detected with a probability of one in a few M bits (or more) and, in this case, it is sometimes desirable to further measure such a defective cell for its detailed characteristics, such as the static characteristic. For the more detailed individual characteristics as set out above, it is not possible to measure the cell transistors individually, for the detailed characteristics, with the use of the cell array TEG alone, while, on the other hand, evaluating the cell transistors, for reliability, with the use of the memory circuit.

Further, in order to effect reliability evaluation with the memory circuit, the memory circuit has to be fabricated with a full process including the manufacturing step of a high withstand transistors, etc., thus resulting in a prolonged term of fabrication and a lowered efficiency of evaluation. Many input signals are required in a timed way to an associated circuit and the measurement as set out above cannot be made with a low-speed DC tester of such a type as to measure a simple TEG area alone. Since the measurement needs to be conducted with an LSI tester high in costs and complicated in operation, the evaluation efficiency is lowered.

As already set out above, the conventional measurement using the cell array TEG cannot be conducted for the reliability evaluation of the cell array, while, on the other hand, the reliability evaluation using the memory circuit cannot measure the detailed characteristic on those defective cells detected, such as the static characteristic. It is, therefore, necessary to, for measurement, use an expensive LSI tester involving a complicated operation.

SUMMARY OF THE INVENTION

It is accordingly the object of the present invention to provide a cell characteristic measuring circuit for a nonvolatile semiconductor memory device which, by one circuit, can satisfy the requirements of both an evaluation using a cell array TEG and reliability evaluation using a memory circuit.

According to the present invention, there is provided a cell characteristic measuring circuit for a nonvolatile semiconductor memory device, comprising: a memory cell array formed on a semiconductor wafer and having a plurality of cell circuits arranged in a matrix array and grouped into a plurality of cell blocks in a column direction, each of the cell circuits including a first select gate transistor and a plurality of nonvolatile memory cells, a group of the plurality of cell circuits arranged in a row defining a cell block as one unit; a plurality of bit lines each connected to one terminal of the first select gate transistors in a corresponding column in the memory cell array; a first select gate line connected to gates of the first select gate transistors in a cell block of the memory cell array; a plurality of word lines each connected to gates of the cell transistors in a corresponding row in a cell block of the memory cell array; a block address decoder for receiving a block address designating the cell blocks, decoding the block address and delivering a decoded signal to the first select gate line of a corresponding cell block; a column address decoder for receiving a column address designating the columns of the memory cell array and decoding the column address; a column selection circuit for selecting the bit lines according to a decoded signal from the column address decoder; a first external terminal connected to the column selection circuit and connected to the bit line selected by the column selection circuit; and a plurality of second external terminals each connected to corresponding word lines in the cell blocks of the memory cell array.

The cell characteristic measuring circuit comprises a block address decoder, column address decoder, column selection circuit, first external terminal connected to a bit line selected by the column selection circuit, and second external terminals each connected to the corresponding word lines in the cell blocks of the memory cell array.

Therefore it is possible to select a cell circuit by selecting a cell block and a column and to set, at a desired voltage, desired word lines through the second external terminals from an outside. The characteristic of the cell transistors can be measured through the first external terminal connected to a selected bit line.

In this case, measurement can be made, with a greater freedom, by, for example, freely setting the word line voltage, directly measuring the cell current. It is, therefore, possible to make measurements as in the conventional case of the measuring a TEG.

Further, reliability evaluation can be done on the results of measurement of those cells in greater amounts, such as the threshold value distribution of cell transistors and the data retaining characteristic. The detailed characteristics, such as the static characteristic on defective cells detected can be measured with a high evaluation efficiency in which case a low-speed and inexpensive DC tester can be used.

That is, according to the present invention it is possible to, by one circuit, satisfy the requirements of both the characteristic evaluation using a cell array TEG and reliability evaluation using a memory circuit.

According to the present invention, there is further provided a cell characteristic measuring circuit for a nonvolatile semiconductor memory device, comprising: a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, the cell circuits which are arranged in a row defining a cell block; a plurality of bit lines each connected to one terminal of the select gate transistors in a corresponding column in the memory cell array; a select gate line connected to gates of the select gate transistors in a cell block of the memory cell array; a plurality of word lines each connected to the gates of the cell transistors in a corresponding row in a cell block of the memory cell array; a block address decoder for decoding a block address signal and selecting a select gate line to select a cell block; a column address decoder for decoding a column address signal; a column selection circuit for receiving a decoded column address signal and selecting a bit line; a first external terminal connected to a bit line selected by the column selection circuit; and a plurality of second external terminals each connected to a corresponding word line in each of the memory cell blocks of the memory cell array.

According to the present invention, there is still further provided a method of measuring a cell characteristic of a nonvolatile semiconductor memory device, the memory device comprising: a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the cell circuits arranged in a row defining a cell block; a plurality of bit lines each connected to one terminal of the select gate transistors in a corresponding column in the memory cell array; a select gate line connected to gates of the select gate transistors in a cell block of the memory cell array; a plurality of word lines each connected to the gates of the cell transistors in a corresponding row in a cell block of the memory cell array; a block address decoder for decoding a block address signal and selecting a select gate line to select a cell block; a column address decoder for decoding a column address signal; a column selection circuit for receiving a decoded column address signal and selecting a bit line; a first external terminal connected to a bit line selected by the column selection circuit; a plurality of second external terminals each connected to a corresponding word line in each of the memory cell blocks of the memory cell array; the method comprising the steps of: applying a voltage to non-selected word lines in the selected cell block via the second external terminals connected to the non-selected word lines to turn on the cell transistors connected to the non-selected word lines in the selected cell block; applying a voltage to a selected word line in the selected cell block via a second external terminal which is connected to the selected word line and changing the voltage value from a negative value to a positive value; and measuring a current flowing through the first external terminal while the voltage applied to the selected word line is changed to obtain a cell characteristic of a selected memory cell which the selected word line and the selected bit line are connected to.

According to the present invention, there is yet further provided a cell characteristic measuring circuit for a non-volatile semiconductor memory device, comprising: a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the cell circuits arranged in a row defining a cell block; a plurality of bit lines each connected to one terminal of the select gate transistors in a corresponding column in the memory cell array; a select gate line connected to gates of the select gate transistors in a cell block of the memory cell array; a plurality of word lines each connected to the gates of the cell transistors in a corresponding row in a cell block of the memory cell array; a block address decoder for decoding a block address signal and selecting a select gate line to select a cell block; a column address decoder for decoding a column address signal; a first column selection circuit arranged on one side of the memory cell array in the column direction, for receiving a decoded column address signal and selecting a first bit line; a first external terminal connected to a first bit line selected by the column selection circuit; a second column selection circuit arranged on the other side of the memory cell array in the column direction, for receiving the decoded column address signal and selecting a second bit line; a second external terminal connected to a first bit line selected by the column selection circuit; and a plurality of second external terminals each connected to a corresponding word line in each of the memory cell blocks of the memory cell array.

According to the present invention, there is further provided a method of measuring a cell characteristic of a nonvolatile semiconductor memory device, the memory device comprising: a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the cell circuits arranged in a row defining a cell block; a plurality of bit lines each connected to one terminal of the select gate transistors in a corresponding column in the memory cell array; a select gate line connected to gates of the select gate transistors in a cell block of the memory cell array; a plurality of word lines each connected to the gates of the cell transistors in a corresponding row in a cell block of the memory cell array; a block address decoder for decoding a block address signal and selecting a select gate line to select a cell block; a column address decoder for decoding a column address signal; a first column selection circuit arranged on one side of the memory cell array in the column direction, for receiving a decoded column address signal and selecting a first bit line; a first external terminal connected to a first bit line selected by the column selection circuit; a second column selection circuit arranged on the other side of the memory cell array in the column direction, for receiving the decoded column address signal and selecting a second bit line; a second external terminal connected to a first bit line selected by the column selection circuit; and a plurality of third external terminals each connected to a corresponding word line in each of the memory cell blocks of the memory cell array, the method comprising the steps of: applying a voltage to non-selected word lines in the selected cell block via the third external terminals connected to the non-selected word lines to turn on the cell transistors connected to the non-selected word lines in the selected cell block; applying a voltage to a selected word line in the selected cell block via a third external terminal which is connected to the selected word line and changing the voltage value from a negative value to a positive value; and measuring a current flowing through the first external terminal and a current flowing through the second external terminal while the voltage applied to the selected word line is changed to obtain a cell characteristic of each of the first and second cell transistors which the selected word line and the first and second bit lines are connected to.

According to the present invention, there is still further provided a cell characteristic measuring circuit for a nonvolatile semiconductor memory device, comprising: a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the cell circuits arranged in a row defining a cell block; a plurality of bit lines each connected to one terminal of the select gate transistors in a corresponding column in the memory cell array; a select gate line connected to gates of the select gate transistors in a cell block of the memory cell array; a plurality of word lines each connected to the gates of the cell transistors in a corresponding row in a cell block of the memory cell array; a block address decoder for decoding a block address signal and selecting a select gate line to select a cell block; a column address decoder for decoding a column address signal; a column selection circuit for receiving a decoded column address signal and selecting a plurality of bit lines; a plurality of first external terminals connected to the bit lines selected by the column selection circuit; and a plurality of second external terminals each connected to a corresponding word line in each of the memory cell blocks of the memory cell array.

According to the present invention, there is yet further provided a method of measuring a cell characteristic of a nonvolatile semiconductor memory device, comprising: a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the cell circuits arranged in a row defining a cell block; a plurality of bit lines each connected to one terminal of the select gate transistors in a corresponding column in the memory cell array; a select gate line connected to gates of the select gate transistors in a cell block of the memory cell array; a plurality of word lines each connected to the gates of the cell transistors in a corresponding row in a cell block of the memory cell array; a block address decoder for decoding a block address signal and selecting a select gate line to select a cell block; a column address decoder for decoding a column address signal; a column selection circuit for receiving a decoded column address signal and selecting a plurality of bit lines; a plurality of first external terminals connected to the bit lines selected by the column selection circuit; and a plurality of second external terminals each connected to a corresponding word line in each of the memory cell blocks of the memory cell array, the method comprising the steps of: applying a voltage to non-selected word lines in the selected cell block via the second external terminals connected to the non-selected word lines to turn on the cell transistors connected to the non-selected word lines in the selected cell block; applying a voltage to a selected word line in the selected cell block via a second external terminal which is connected to the selected word line and changing the voltage value from a negative value to a positive value; and measuring a current flowing through each of the first external terminals while the voltage applied to the selected word line is changed to obtain a cell characteristic of each of selected cell transistors which the selected word line and the selected bit lines are connected to.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a block diagram showing a cell characteristic measuring circuit of a NAND type EEPROM according to a second embodiment of the present invention;

FIG. 4 is a cross-sectional view showing one form of diodes in FIG. 3 which are connected anode-to-anode;

FIG. 9 is a circuit diagram showing one of the AND gates shown in FIGS. 7B, 7C and 8B.

FIG. 10 is a circuit diagram showing one practical form of a column selection circuit in FIG. 1.

DETAILED DESCRIPTION OF THE PREFERRED EMBODIMENTS

The embodiments of the present invention will be explained below with reference to the accompanying drawings.

Figure 1:
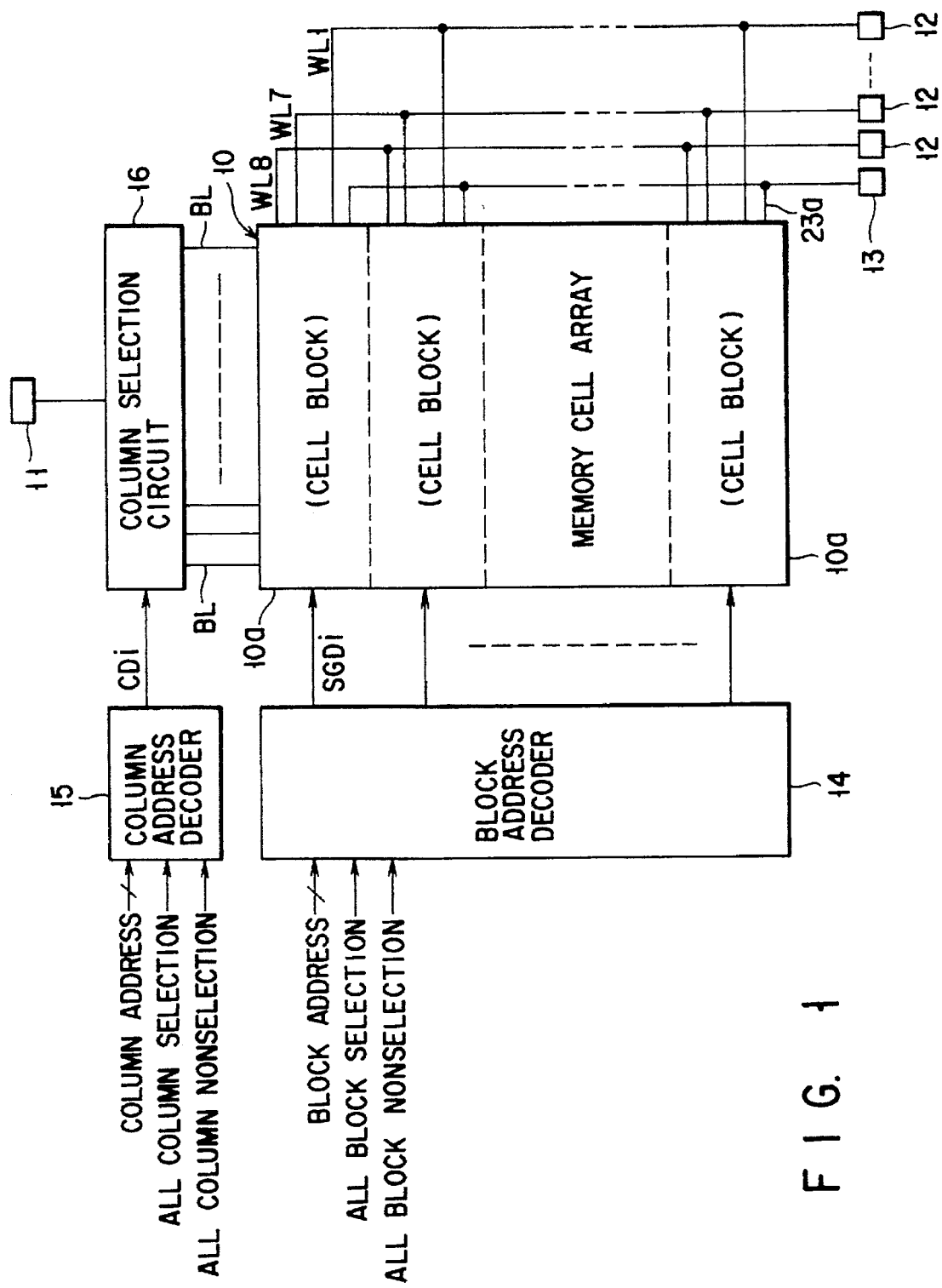
FIG. 1 is a block diagram showing a cell characteristic measuring circuit of a NAND type EEPROM according to a first embodiment of the present invention.

FIG. 1 shows a cell characteristic measuring circuit of an NAND type EEPROM according to a first embodiment of the present invention. The measuring circuit is provided, for example, at a test element group area or a chip area of a semiconductor wafer.

Figure 2:
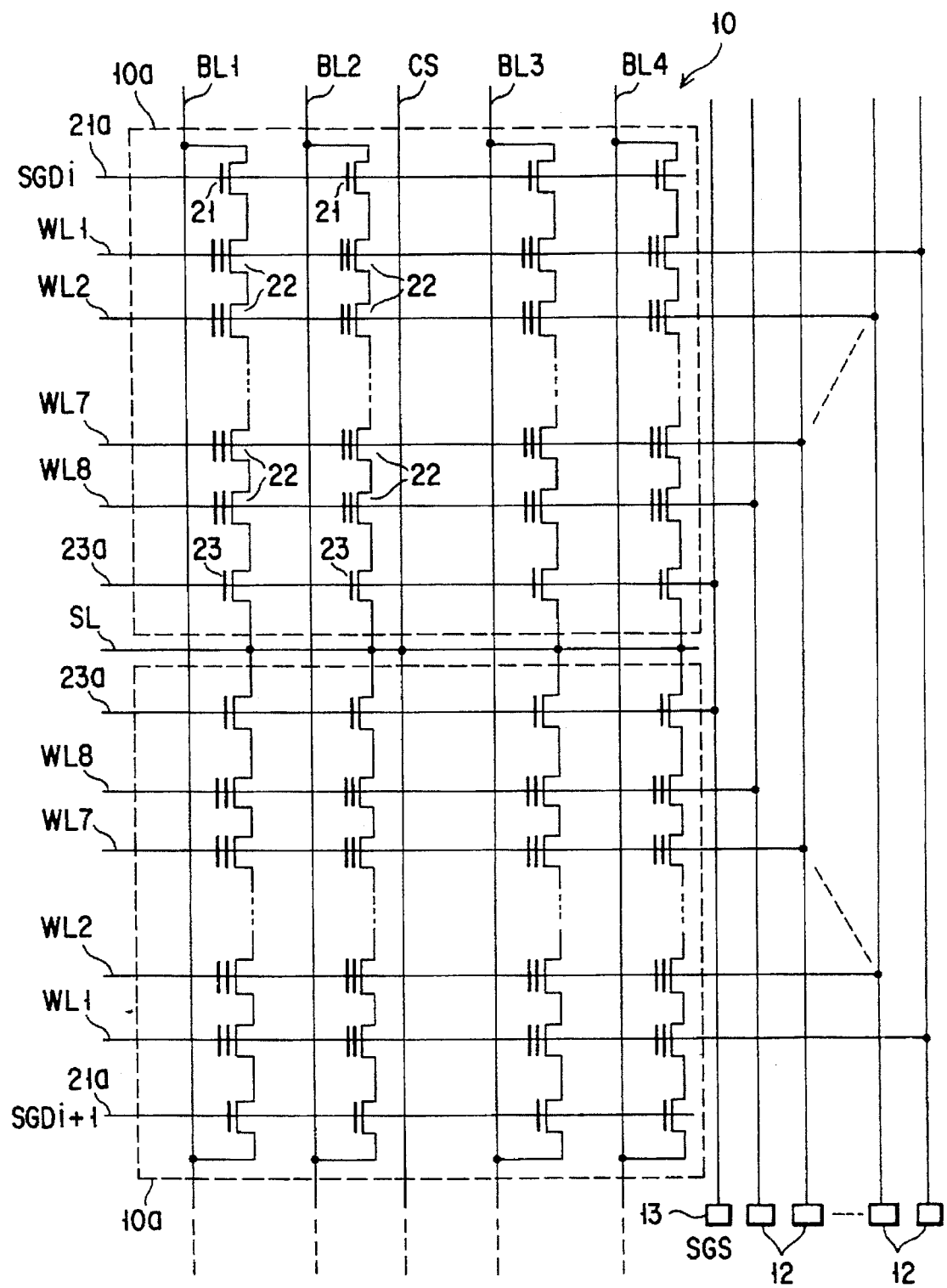
FIG. 2 is a circuit diagram showing part of a cell array in FIG. 1 and external terminals connected to the cell array.

FIG. 2 shows a portion (two cell blocks) of a memory cell array 10 and external terminals 12, 13 connected to the memory cell in FIG. 1.

In FIG. 1, reference numeral 10 shows a memory cell array of a NAND type EEPROM. The memory cell array 10 comprises, as shown in FIG. 2, a plurality of cell circuits arranged in a matrix each having a first gate transistor 21 and a plurality of series-connected nonvolatile memory cells connected in series to the first gate transistor 21. Those of cell blocks 10a, which are arranged in a row constitute one cell block 10a, and a plurality of cell blocks 10a are arranged in a column direction.

In this embodiment, each cell circuit comprises a NAND string having a first select gate transistor 21, series-connected (in this embodiment, one byte=8 bits) cell transistors 22 and a second select gate transistor 23, all connected in series. One terminal of the second select gate transistors 23 of all the cell circuits in each cell block is connected through one of the source line SL to a common source line.

A plurality of bit lines BL1, BL2, ... are connected to one terminal of the first select gate transistors 21 of a plurality of sets of NAND strings (represented by two sets in the present embodiments) in the same columns on the memory cell array 10. In this embodiment, four bit lines are shown as represented ones.

That is, the respective NAND string is of such a type that, between the bit line BL1, BL2 ... on one hand and the source line SL on the other, a series circuit is connected as a circuit comprising the bit line-side select gate transistor 21, cell transistors 22 and source-side select gate transistor 23, all in series.

The first select gate line 21a is connected in common with the gates of the bit line-side first select gate transistors 21 of a cell block 10a in the memory cell array 10. Block select gate signals SGDi (i=1, 2, ... ), SGDi+1 ... are supplied to the first select gate lines 21a of the respective cell blocks 10a.

The second select gate line 23a is connected to the gates of the source line-side second select gate transistors 23 in a cell block 10a.

Word lines WL1, WL2 ... are connected to the control gates of the cell transistors 22 in corresponding rows in a cell block 10a. That is, for example, the word line WL1 is connected in common with the control gates of the cell transistors 22 connected directly to the first select gate transistors 21. Further, the word line WL8, for example, is connected in common with the control gates of the cell transistors 22 directly connected to the second select gate transistors 23.

When a block address decoder 14 receives a block address for designating either one of cell blocks 10a in the memory cell array 10, the block address decoder 14 decodes the block address and generates one of block select gate signals SGDi, SGDi+1 ... Further, upon receipt of an all selection signal, i.e., a signal for designating all the cell blocks 10a, the block address decoder generates an all block selection gate signal. The all block selection may be used in a mode where data stored in all the cell transistors 22 of the memory cell array 10 are erased at a time, or a mode where data is written into all the cell transistors 22 of the memory cell array 10 at a time. While, on the other hand, upon receipt of an all block nonselection signal, i.e., a signal for designating no blocks 10a, the block address decoder generates a no block selection gate signal. The all block non-selection may be used in the case where it is desired to determine how much background current flows in the memory cell array 10.

Upon receipt of a column address for designating any column line (bit line) of the memory cell array 10, a column address decoder 15 decodes the column address and generates one of column selection signals CDi (i=1, 2, ... ). Further, upon receipt of an all column selection signal, i.e., a signal for designating an all column selection signal, the column address decoder generates an all column selection signal while, on the other hand, upon receipt of an all column nonselection signal, i.e., a signal for designating no columns, the column address decoder 15 generates a no column selection signal.

A column selection circuit 16 is connected to the column address decoder 15 and, in accordance with an output signal of the column address decoder 15, selects one of column lines (bit lines) BLi (i=1, 2, . . . ), or all the column lines or no column lines.

A first external voltage supply terminal 11 is connected to the column selection circuit 16 and connected to bit lines BL selected by the column selection circuit 16.

A plurality of second external terminals 12 are connected to the corresponding word lines in each cell block 10. For example, a second external terminal 12 is connected to word line WL1 in all the cell blocks 10a. Another second external terminal 12 is connected to word line WL2 in all the cell blocks 10a. In this embodiment, eight second external terminals are provided in correspondence to eight word lines WL1, WL2 . . . W8. Via the external terminals 12, a desired word line voltage can be supplied to the corresponding word line.

A third external terminal 13 is connected to a second select gate line 23a in each cell block 10a of the cell array 10. A desired gate voltage SGS can be supplied by the second select gate line 23a to the gates of all the second select gate transistors 23 via the external terminal 13.

The source line-side second select gate transistors 23 are provided to cut off a DC current path in a write operation mode of the memory so that it is not necessary to effect control by a decoded address signal. To this end, transistors 23 have their gates connected in common with each other.

Figure 7A:
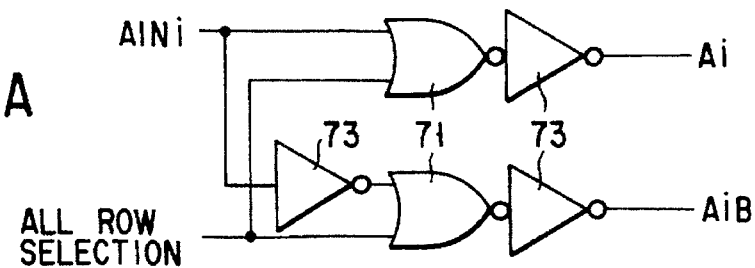
FIG. 7A is a circuit showing one form of a row address buffer in the cell characteristic measuring circuit of the present invention.
Figure 7B:
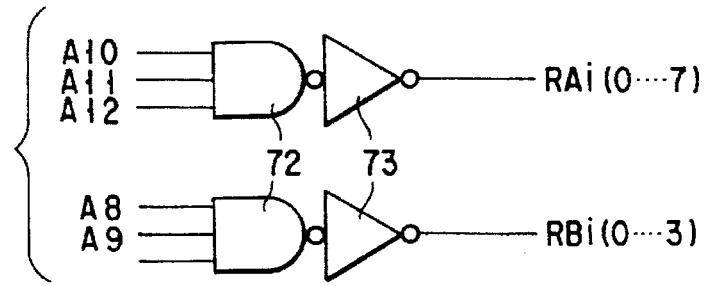
FIG. 7B is a circuit showing one form of a row predecoder in the cell characteristic measuring circuit of the present invention.
Figure 7C:
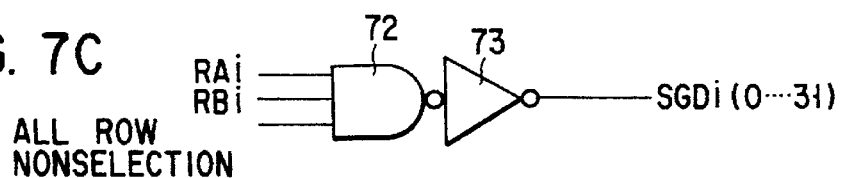
FIG. 7C is a circuit showing a row select gate decoder in the cell characteristic measuring circuit of the present invention.

FIGS. 7A, 7B and 7C show a row address buffer, a row predecoder and row select gate decoder in the block address decoder 14.

The row address buffer comprises NOR gates 71 and inverters 73, as shown in FIG. 7A. The row predecoder comprises NAND gates 72 and inverter 73, as shown in FIG. 7B. The row select gate decoder comprises a NAND gate 72 and an inverter 73, as shown in FIG. 7C.

Figure 8A:
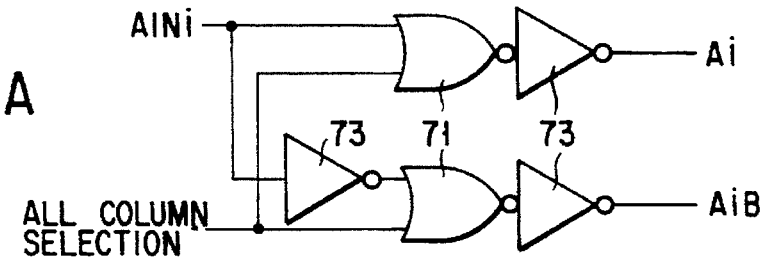
FIG. 8A is a circuit showing a column address buffer in the cell characteristic measuring circuit of the present invention.
Figure 8B:
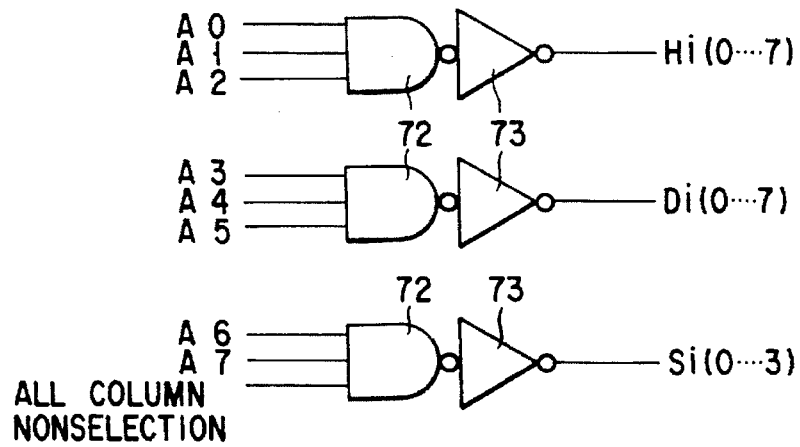
FIG. 8B is a circuit showing a column decoder in the cell characteristic measuring circuit of the present invention.
Figure 11:
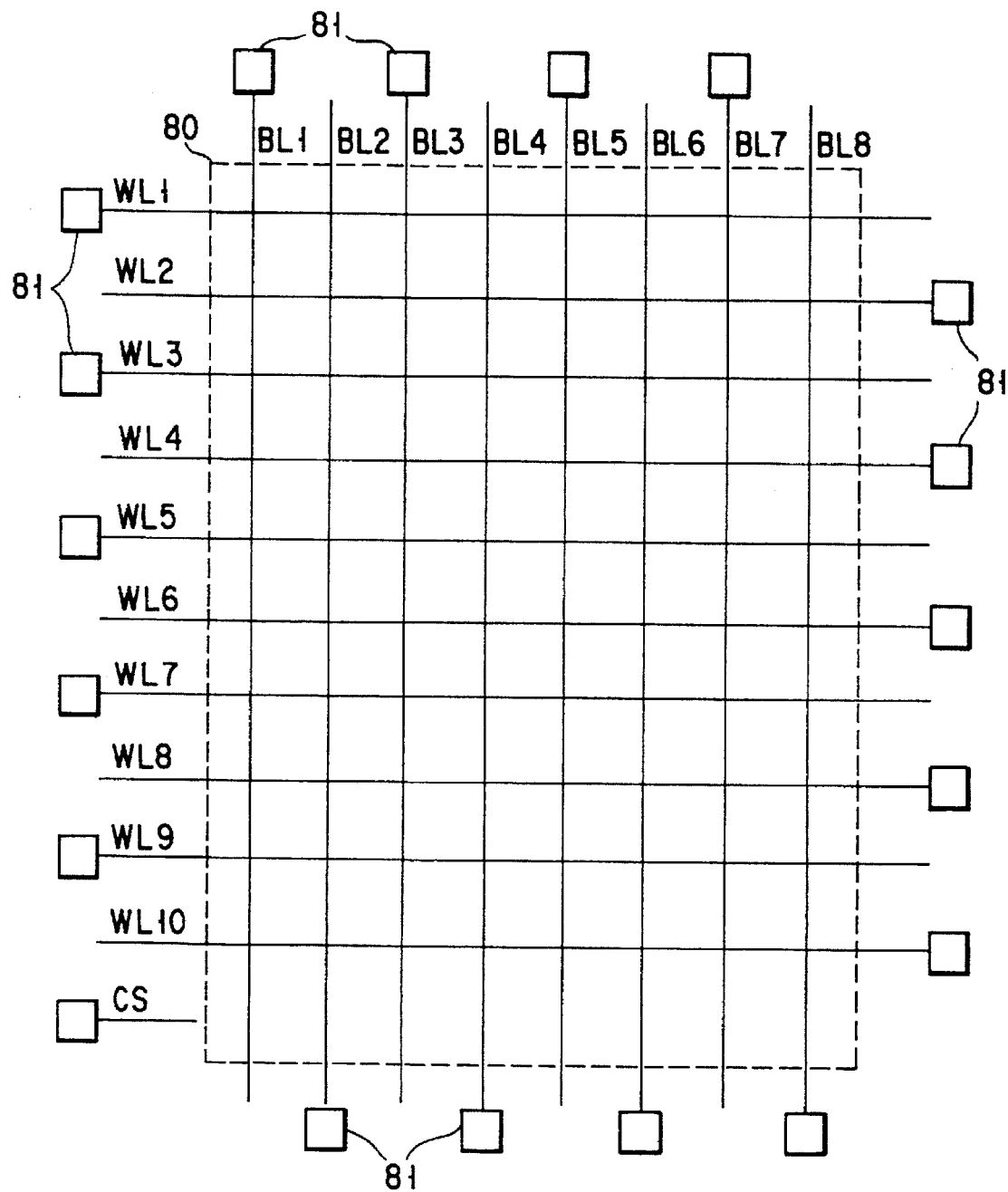
FIG. 11 shows an arrangement of a TEG formed over a conventional semiconductor wafer.

FIGS. 8A and 8B shows a column address buffer and column decoder in the column address decoder 15 in FIG. 1.

The column address buffer comprises NOR gates 71 and inverters 73, as shown in FIG. 8A. The column decoder comprises NAND gates 72 and inverters 73, as shown in FIG. 8B.

In FIGS. 7A to 7C and FIGS. 8A and 8B, reference numeral 71 represents a NOR gate; 72, a NAND gate; and 73, an inverter, these being constructed of the same kind of MOS transistors. For example, an AND gate constituted by the NAND gate 72 and inverter 73 can be constructed of a plurality of NMOS transistors 74 as shown in FIG. 9. VM is a bias voltage. FIG. 10 represents one example of the column selection circuit 16 in FIG. 16, noting that 74 is comprised of an NMOS transistor.

Explanation will be given below of the method for measuring the cell characteristics on a cell characteristic measuring circuit of the present embodiment.

The cell characteristic measuring circuit has, as shown in FIG. 1, the block address decoder 14, column address decoder 15, column selection circuit 16, first external terminal 11 connected to the bit lines selected by the column section circuit 16, second external terminals 12 each connected to the corresponding word line in each cell block of the memory cell array, and third external terminal 13 commonly connected to the second select gate line in each cell block of the memory cell array.

The NAND string can be selected by selecting one of the cell blocks by means of the block address decoder 14 and one column line by means of the column address decoder 15 and column selection circuit 16. Further, a voltage on the word line can be set to a desired level from the outside through the second external terminals 12. By conducting each second select gate transistor 23, as required, through the third external terminal 13 it it possible to supply a desired source voltage to the respective NAND string through the common source line. In this way, the characteristic of the cell transistor can be measured through the first external terminal 11 connected to the selected bit line. It is, therefore, possible to make such measurements as in the case of measuring a TEG.

With those non-selected NAND strings staying OFF, voltages on those word lines, that is, on those non-selected lines, in a selected NAND string are made sufficiently higher than a threshold value of the cell transistors through the second external terminals 12 from the outside to render, conductive, the cell transistors on the non-selected lines involved. In this state, it is possible to vary voltages on the control gates of the cell transistors on the selected line. At this time, the variation of current in the cell transistors is measured and, by doing so, it is possible to detect the threshold value of the cell transistor.

Further, the voltage on the word line is readily controlled from a negative voltage side at a time of measuring the cell characteristic, without electrically isolating the word line from the substrate, and it is possible to correctly measure the variation of a current in the cell transistors even in the case of the threshold value of the cell transistors in the NAND type EEPROM being distributed in a range of about −2 V to 2 V.

Further, data on all cell transistors involved in the cell array can be erased through the application of a negative high voltage to all the word lines involved.

On the other hand, data on all cell transistors can be written through the application of a positive high voltage to all the word lines involved.

During the measurement of the cell characteristic as set out above, the circuit operation can be performed in a static fashion and measurement can be made with a slow-speed DC test as in the case of measuring a TEG.

That is, according to the cell characteristic measuring circuit of the embodiment above, it is possible to freely set the word line voltage and directly measure the cell current and hence make measurements with a greater latitude, so that measurements can be effected as in the case of the TEG. It is also possible to evaluate the reliability level demanding results of measurement on large amounts of cells, such as the threshold value distribution of cell transistors and the data holding characteristics. Further, those minute characteristics, such as the static characteristic relating to defective cells detected, can be measured with high evaluation efficiency, thus allowing the use of slow-speed low-cost DC testers.

In other words, both the characteristic evaluation and reliability evaluation can be made according to the present invention: a characteristic evaluation using the cell-array TEG for one circuit and reliability evaluation using the circuit of the present embodiment.

Further, even in the case where the word line is set at a high voltage, it is not necessary to supply high voltage to the circuit of the block address decoder, etc., as well as to use high-withstand transistors. This enables the process to be simplified.

The block address decoder as set out above eliminates the need to effect any potential switching and can be constructed using simplified AND circuits.

As shown in FIGS. 7A to 7C through FIG. 10, associated peripheral circuits can be constructed of a plurality of NMOS transistors 74 only. In the case where the select gate transistors 21, 23 in the cell array 10 are comprised of NMOS transistors these NMOS transistors can be formed in the same process and, as a result, it is possible to largely reduce the processing required in the formation of the test circuit.

FIG. 3 shows part of the cell characteristic measuring circuit for an NAND EEPROM in accordance with a second embodiment of the present invention.

This cell characteristic measuring circuit is the same as that of FIG. 1 except in the following aspects, noting that the same reference numerals are employed to designate parts or elements corresponding to those shown in FIG. 1.

That is, two input-protecting diodes D1, D2 are connected, anode-to-anode, in series array between each second external terminal 12 and a ground node and, similarly, two input-protecting diodes D1, D2 are connected, anode-to-anode, in series array between a third external terminal 13 and a ground node.

FIG. 4 shows one example of the diodes D1, D2 in the anode-to-anode structure.

Here, reference numeral 40 denotes, for example, an n-type semiconductor substrate; 41, a p-type well formed in the surface portion of the n type surface; 42, a first $n^+$-type impurity diffusion region formed in the surface portion of the p type well and 43, a second $n^+$-type impurity diffusion region formed in the surface portion of the n type substrate. The first $n^+$-type impurity diffusion region 42 is connected to the second external terminal 12 or the third external terminal 13 and the second $n^+$-type impurity diffusion region 43 is connected to the ground node. As appreciated from FIG. 4, a PN junction between the p-type well 41 and the first $n^+$-type impurity region and a PN junction between the p-type well 41 and the second $n^+$-type impurity region 43 are connected in an array shown in FIG. 3.

According to the cell characteristic measuring circuit in FIG. 3, even if a negative voltage is applied to the word line, one PN Junction of the anode-to-anode connected diodes D1 and D2 is reverse-biased so that there is no flow of electric current. It is, therefore, possible to supply a negative voltage, without any hindrance, as in the absence of such diodes as connected anode-to-anode. Further, the diodes D1 and D2 upon the supply of a high voltage in excess of a breakdown voltage of the PN junction to the word line enable electric current to be drawn into the substrate, thus serving as an input protection. Further, input protection diodes can be provided without any process overhead.

Figure 5:
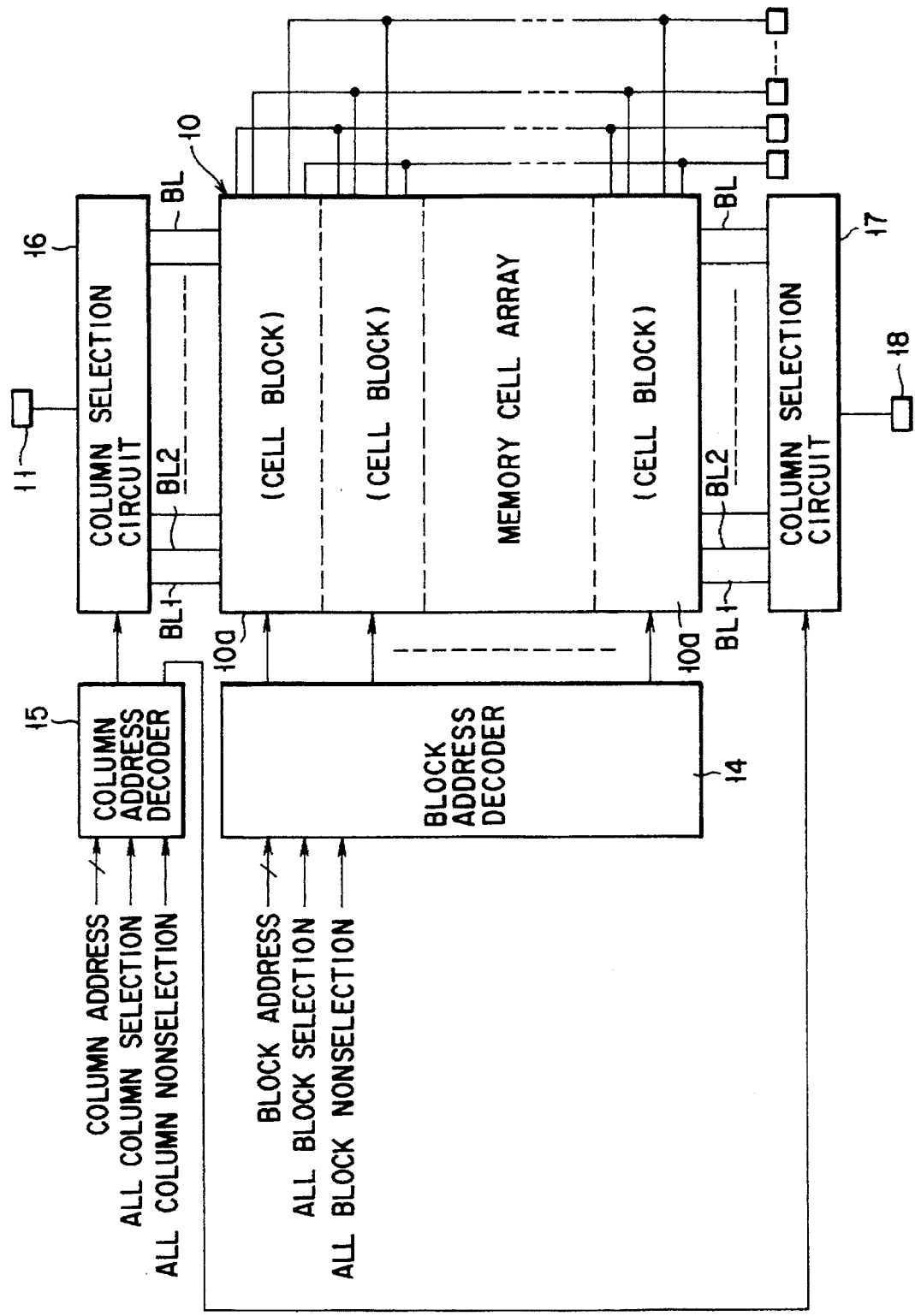
FIG. 5 is a block diagram showing a cell characteristic measuring circuit of a NAND type EEPROM according to a third embodiment of the present invention.

FIG. 5 shows part of a cell characteristic circuit of a NAND type EEPROM according to a third embodiment of the present invention.

This cell characteristic measuring circuit, upon being compared with the cell characteristic measuring circuit of the first embodiment as set out in conjunction with FIG. 1, includes a further column selection circuit (second column selection circuit 17) as distinct from the column selection circuit (the first column selection circuit 16). These two column selection circuits 16 and 17 are arranged on both sides of a cell array 10 and adapted to be commonly controlled by a column address decoder 15. A fourth external terminal 18 is provided relative to the second column selection circuit 17. In this embodiment, two bit lines can be simultaneously selected by the column selection circuits 16 and 17, an aspect which is different from that of the first embodiment. For example, column selection circuit 16 may select an odd numbered bit line and column selection circuit 17 may select an even numbered bit line. In the third embodiment, the same reference numerals are employed to designate parts or elements correspond to those shown in the first embodiment.

According to the cell characteristic measuring circuit of the third embodiment, the characteristic of cell transistors corresponding to two bits can be measured at a time, thus enabling the measuring time to be reduced to substantially one half that of the cell characteristic measuring circuit of the first embodiment.

Further, the pitch of the bit lines of the cell array is usually designed on a minimum rule and a fairly complex pattern layout is required if the first column selection circuit 16 is to be designed in accordance with the pitch of the bit line. According to the arrangement of the third embodiment, the first and second column selection circuits 16 and 17 have to be designed in accordance with twice the pitch of the bit lines, resulting in a simplified pattern layout.

Figure 6:
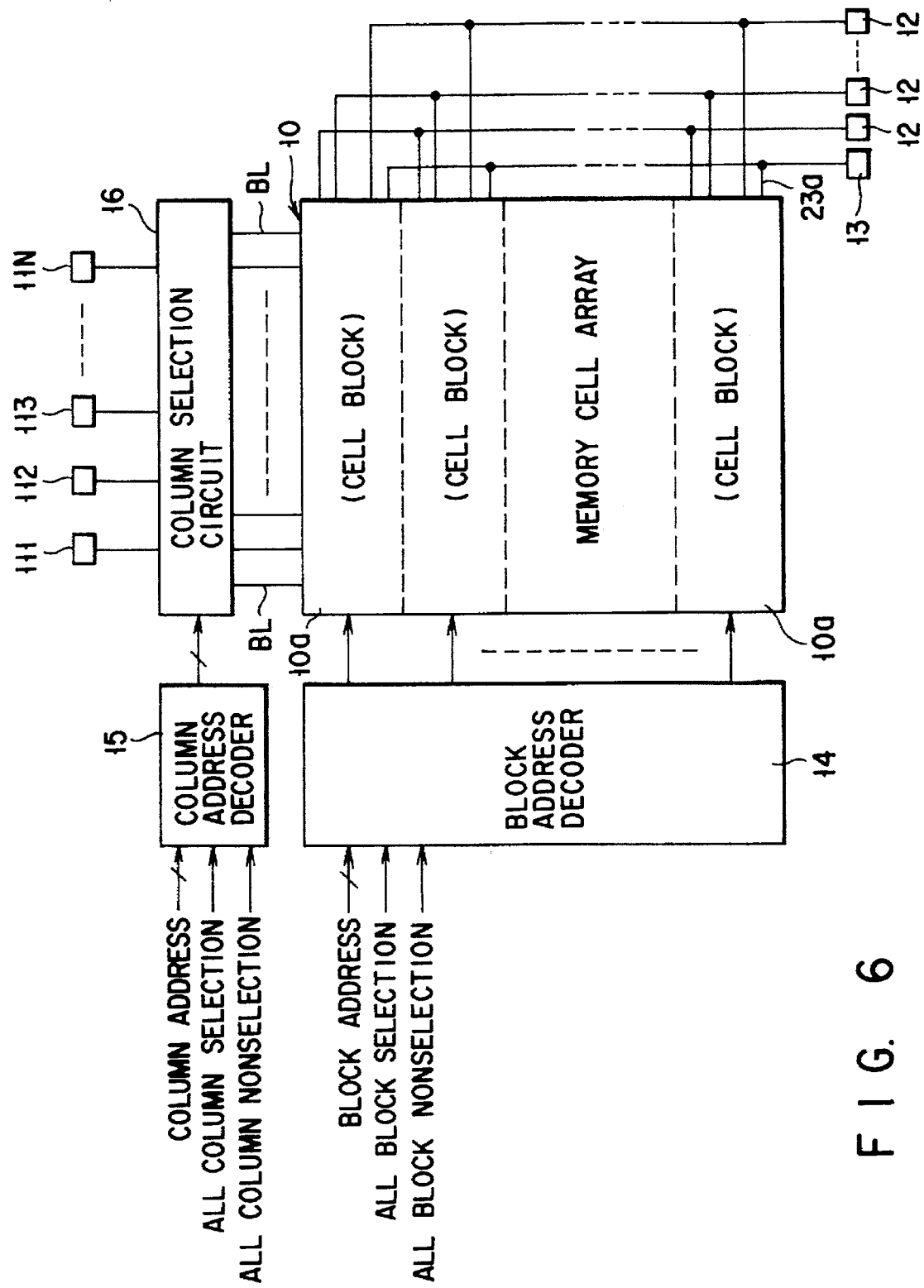
FIG. 6 is a block diagram showing a cell characteristic measuring circuit of an EEPROM according to a fourth embodiment of the present invention.

FIG. 6 shows part of the cell characteristic measuring circuit for a NAND type EEPROM according to a fourth embodiment of the present invention.

In comparison with the cell characteristic measuring circuit of the first embodiment as set out in reference to FIG. 1, the cell characteristic measuring circuit of the fourth embodiment can select a predetermined number of bit lines BL at a time. Specifically, the column selection circuit 16 is controlled by the column address decoder 15 to select an N number of bit lines BL at a time. N is eight, for example. An N number of first external terminals 11I to 11N are connected to the column selection circuit 16. The column selection circuit 16 can select a given N bit lines at a time and, in accordance with the N bit lines, the N number of first external terminals 11I to 11N are connected to the circuit 16, an aspect which is different from that of the first embodiment. In the fourth embodiment, the same reference numerals are employed to designate parts or elements corresponding to those shown in FIG. 1.

In the cell characteristic measuring circuit of the fourth embodiment, use is made of a greater number of external terminals 11I to 11N, but it is possible to measure the characteristics of cell transistors corresponding to N bits at a time and to reduce the measuring time to substantially 1/N compared with the cell characteristic measuring circuit of the first embodiment.

Further, the present invention can be reduced to practice through a combination of the third embodiment with the fourth embodiment.

Although the above-mentioned embodiments have been explained as being used for the NAND type EEPROM, the present invention is not restricted thereto. The present invention can also be applied to an EEPROM equipped with a so-called AND type memory array where cell circuits are arranged as a matrix array with a plurality of cell transistors connected in parallel array to other-end terminals of first select gate transistors.

According to the present invention, a cell characteristic measuring circuit for a nonvolatile semiconductor device can be provided which, by one circuit, can satisfy both the requirements necessary to the characteristic evaluation using a cell array TEG and reliability evaluation using a memory circuit.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cell characteristic measuring circuit for a nonvolatile semiconductor memory device, comprising:
   a memory cell array having a plurality of cell circuits arranged in a matrix array and grouped into a plurality of cell blocks in a column direction, each of the cell circuits including a first select gate transistor and a plurality of nonvolatile memory cells each including a cell transistor, a group of the plurality of cell circuits arranged in a row direction defining a cell block as one unit;
   a plurality of bit lines each connected to one terminal of each of the first select gate transistors in a corresponding column in the memory cell array;
   a first select gate line connected to gates of the first select gate transistors in a cell block of the memory cell array;
   a plurality of word lines each connected to gates of the cell transistors in a corresponding row in a cell block of the memory cell array;
   a block address decoder for receiving a block address designating the cell blocks, decoding the block address and delivering a decoded signal to the first select gate line of a corresponding cell block;
   a column address decoder for receiving a column address designating the columns of the memory cell array and decoding the column address;
   a first column selection circuit for selecting the bit lines according to a decoded signal from the column address decoder;
   a first external terminal connected to the first column selection circuit and connected to a bit line selected by the first column selection circuit; and
   a plurality of second external terminals each connected to corresponding word lines in the cell blocks of the memory cell array.

2. The cell characteristic measuring circuit according to claim 1, wherein
   the block address decoder delivers a decoded signal designating all the cell blocks upon receipt of a selection signal designating all the cell blocks and delivers no decoded signal upon receipt of a nonselection signal designating none of the cell blocks.

3. The cell characteristic measuring circuit according to claim 1, wherein
   the column address decoder delivers a decoded signal designating all the columns upon receipt of a selection signal designating all the memory cell arrays and delivers no decoded signal upon receipt of a nonselection signal designating none of the columns.

4. The cell characteristic measuring circuit according to claim 1, further comprising two input protection diodes connected in series in an opposite relationship between the respective second external terminals and a ground node.

5. The cell characteristic measuring circuit according to claim 1, further comprising a second column selection circuit for selecting the bit lines according to the decoded signal from the column address decoder and a fourth external terminal connected to a bit line selected by the second column selection circuit.

6. The cell characteristic measuring circuit according to claim 1, wherein said column address decoder controls said first column selection circuit to select N bit lines at a time and, wherein said first external terminal includes N first external terminals each connected to one of N bit lines selected by the first column selection circuit.

7. The cell characteristic measuring circuit according to claim 1, wherein the first select gate transistors include an NMOS transistor, and said block address decoder, said address decoder and said column selection circuit each include a plurality of NMOS transistors.

8. The cell characteristic measuring circuit according to claim 1, wherein said first and second select gate transistors each include an NMOS transistor and said block address decoder, said column address decoder and said column selection circuit each include a plurality of NMOS transistors.

9. The cell characteristic measuring circuit according to claim 1, wherein
   each of the cell circuits comprises a NAND string including the first select gate transistor, the nonvolatile memory cells connected in series and a second select gate transistor;
   the second select gate transistor in each cell circuit of the memory cell array having one terminal connected to a common source line;
   a second select gate line is connected to the gates of the second select gate transistors of the cell circuits in a corresponding cell block of the memory cell array; and
   a third external terminal connected to the second select gate lines of the cell blocks in the memory cell array.

10. The cell characteristic measuring circuit according to claim 9, further comprising two input protection diodes connected in series in an opposite relationship between the third external terminal and a ground node.

11. A cell characteristic measuring circuit for a nonvolatile semiconductor memory device, comprising:
    a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the plurality of cell circuits arranged in a row direction defining a cell block;
    a plurality of bit lines each connected to one terminal of each of the select gate transistors in a corresponding column in the memory cell array;
    a select gate line connected to gates of the select gate transistors in a cell block of the memory cell array;
    a plurality of word lines each connected to the gates of the cell transistors in a corresponding row in a cell block of the memory cell array;
    a block address decoder for decoding a block address signal and selecting a select gate line to select a cell block;
    a column address decoder for decoding a column address signal;
    a column selection circuit for receiving a decoded column address signal and selecting a bit line;
    a first external terminal connected to the bit line selected by the column selection circuit; and
    a plurality of second external terminals each connected to a corresponding word line in each of the memory cell blocks of the memory cell array.

12. A cell characteristic measuring circuit for a nonvolatile semiconductor memory device, according to claim 11, further comprising a pair of diodes oppositely inserted in series between each of the second external terminals and ground.

13. A cell characteristic measuring circuit for a nonvolatile semiconductor memory device, according to claim 11, further comprising a third external terminal connected to the select gate line and a pair of diodes oppositely inserted in series between the third external terminal and ground.

14. A method of measuring a cell characteristic of a nonvolatile semiconductor memory device, the memory device comprising,
- a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the plurality of cell circuits arranged in a row direction defining a cell block;
- a plurality of bit lines each connected to one terminal of each of the select gate transistors in a corresponding column in the memory cell array;
- a select gate line connected to gates of the select gate transistors in a cell block of the memory cell array;
- a plurality of word lines each connected to the gates of the cell transistors in a corresponding row in a cell block of the memory cell array;
- a block address decoder for decoding a block address signal and selecting a select gate line to select a cell block;
- a column address decoder for decoding a column address signal;
- a column selection circuit for receiving a decoded column address signal and selecting a bit line;
- a first external terminal connected to the bit line selected by the column selection circuit;
- a plurality of second external terminals each connected to a corresponding word line in each of the memory cell blocks of the memory cell array;

the method comprising the steps of:
- applying a voltage to non-selected word lines in the selected cell block via the second external terminals connected to the non-selected word lines to turn on the cell transistors connected to the non-selected word lines in the selected cell block;
- applying a voltage to a selected word line in the selected cell block via a second external terminal connected to the selected word line to change the voltage value; and
- measuring a current flowing through the first external terminal while the voltage applied to the selected word line is changed to obtain a cell characteristic of a selected memory cell which the selected word line and the selected bit line are connected to.

15. A cell characteristic measuring circuit for a nonvolatile semiconductor memory device, comprising:
- a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the plurality of cell circuits arranged in a row direction defining a cell block;
- a plurality of bit lines each connected to one terminal of each of the select gate transistors in a corresponding column in the memory cell array;
- a select gate line connected to gates of the select gate transistors in a cell block of the memory cell array;
- a plurality of word lines each connected to the gates of the cell transistors in a corresponding row in a cell block of the memory cell array;
- a block address decoder for decoding a block address signal and selecting a select gate line to select a cell block;
- a column address decoder for decoding a column address signal;
- a first column selection circuit arranged on one side of the memory cell array in the column direction, for receiving a decoded column address signal and selecting a first bit line;
- a first external terminal connected to the first bit line selected by the first column selection circuit;
- a second column selection circuit arranged on the other side of the memory cell array in the column direction, for receiving the decoded column address signal and selecting a second bit line;
- a second external terminal connected to the second bit line selected by the second column selection circuit; and
- a plurality of third external terminals each connected to a corresponding word line in each of the memory cell blocks of the memory cell array.

16. A cell characteristic measuring circuit for a nonvolatile semiconductor memory device, according to claim 15, comprising a pair of diodes oppositely inserted in series between each of the third external terminals and ground.

17. A method of measuring a cell characteristic of a nonvolatile semiconductor memory device, the memory device comprising;
- a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the plurality of cell circuits arranged in a row direction defining a cell block;
- a plurality of bit lines each connected to one terminal of each of the select gate transistors in a corresponding column in the memory cell array;
- a select gate line connected to gates of the select gate transistors in a cell block of the memory cell array;
- a plurality of word lines each connected to the gates of the cell transistors in a corresponding row in a cell block of the memory cell array;
- a block address decoder for decoding a block address signal and selecting a select gate line to select a cell block;
- a column address decoder for decoding a column address signal;
- a first column selection circuit arranged on one side of the memory cell array in the column direction, for receiving a decoded column address signal and selecting a first bit line;
- a first external terminal connected to the first bit line selected by the first column selection circuit;
- a second column selection circuit arranged on the other side of the memory cell array in the column direction, for receiving the decoded column address signal and selecting a second bit line;
- a second external terminal connected to the second bit line selected by the second column selection circuit; and
- a plurality of third external terminals each connected to a corresponding word line in each of the memory cell blocks of the memory cell array, the method comprising the steps of:

applying a voltage to non-selected word lines in the selected cell block via the third external terminals connected to the non-selected word lines to turn on the cell transistors connected to the non-selected word lines in the selected cell block;

applying a voltage to a selected word line in the selected cell block via a third external terminal connected to the selected word line and changing the voltage value from a negative value to a positive value; and measuring a current flowing through the first external terminal and a current flowing through the second external terminal while the voltage applied to the selected word line is changed to obtain a cell characteristic of each of the first and second cell transistors which the selected word line and the first and second bit lines are connected to.

18. A cell characteristic measuring circuit for a nonvolatile semiconductor memory device, comprising:

a memory cell array having a plurality of cell circuits arranged in a matrix array and grouped into a plurality of cell blocks in a column direction, each of the cell circuits including a select gate transistor and a plurality of series-connected cell transistors connected in series to the select gate transistor, a group of the plurality of cell circuits arranged in a row direction defining a cell block;

a plurality of bit lines each connected to one terminal of each of the select gate transistors in a corresponding column in the memory cell array;

a select gate line connected to gates of the select gate transistors in a cell block of the memory cell array;

a plurality of word lines each connected to the gates of the cell transistors in a corresponding row in a cell block of the memory cell array;

a block address decoder for decoding a block address signal and selecting a select gate line to select a cell block;

a column address decoder for decoding a column address signal;

a column selection circuit for receiving a decoded column address signal and selecting a plurality of bit lines;

a plurality of first external terminals connected to the bit lines selected by the column selection circuit; and a plurality of second external terminals each connected to a corresponding word line in each of the memory cell blocks of the memory cell array.

19. A cell characteristic measuring circuit for a nonvolatile semiconductor memory device, according to claim 18, further comprising a pair of diodes oppositely inserted in series between each of the second external terminals and ground.

20. A method of measuring a cell characteristic of a nonvolatile semiconductor memory device, comprising, a memory cell array having a plurality of cell circuits arranged in a matrix array and grouped into a plurality of cell blocks in a column direction, each of the cell circuits including a select gate transistor and a plurality of series-connected cell transistors, connected in series to the select gate transistor, a group of the plurality of cell circuits arranged in a row direction defining a cell block;

a plurality of bit lines each connected to one terminal of each of the select gate transistors in a corresponding column in the memory cell array;

a select gate line connected to gates of the select gate transistors in a cell block of the memory cell array;

a plurality of word lines each connected to the gates of the cell transistors in a corresponding row in a cell block of the memory cell array;

a block address decoder for decoding a block address signal and selecting a select gate line to select a cell block;

a column address decoder for decoding a column address signal;

a column selection circuit for receiving a decoded column address signal and selecting a plurality of bit lines;

a plurality of first external terminals connected to the bit lines selected by the column selection circuit; and a plurality of second external terminals each connected to a corresponding word line in each of the memory cell blocks of the memory cell array, the method comprising the steps of:

applying a voltage to non-selected word lines in the selected cell block via the second external terminals connected to the non-selected word lines to turn on the cell transistors which are connected to the non-selected word lines in the selected cell block;

applying a voltage to a selected word line in the selected cell block via a second external terminal connected to the selected word line and changing the voltage value from a negative value to a positive value; and measuring a current flowing through each of the first external terminals while the voltage applied to the selected word line is changed to obtain a cell characteristic of each of the selected cell transistors which the selected word line and the selected bit lines are connected to.

* * * * *